United States Patent
Nakai

(10) Patent No.: US 7,453,130 B2
(45) Date of Patent: Nov. 18, 2008

(54) SEMICONDUCTOR APPARATUS AND METHOD FOR FABRICATING THE SAME

(75) Inventor: Junichi Nakai, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/782,731

(22) Filed: Feb. 18, 2004

(65) Prior Publication Data

US 2004/0183086 A1 Sep. 23, 2004

(30) Foreign Application Priority Data

Feb. 19, 2003 (JP) ............................. 2003-041791

(51) Int. Cl.
*H01L 31/101* (2006.01)

(52) U.S. Cl. ............... 257/432; 257/445; 257/E31.081; 438/75

(58) Field of Classification Search ................ 257/80, 257/98, 225, 253, 432, 434, 436, 466, 230, 257/E31.078, 233, 445, 435, 448, E31.081; 438/60, 75, 69
See application file for complete search history.

(56) References Cited

U.S. PATENT DOCUMENTS 5,371,397 A * 12/1994 Maegawa et al. ........... 257/432
5,691,548 A * 11/1997 Akio ........................... 257/232
5,739,548 A * 4/1998 Shigeta et al. ................ 257/59
6,104,021 A 8/2000 Ogawa
6,586,811 B2 * 7/2003 Sekine ........................ 257/432
6,784,014 B2 * 8/2004 Tanigawa ..................... 438/60
7,075,164 B2 * 7/2006 Uya ............................ 257/431
2003/0168679 A1 * 9/2003 Nakai et al. .................. 257/291

FOREIGN PATENT DOCUMENTS

| JP | 04111354 A | * | 4/1992 |
| JP | 11-040787 | | 2/1999 |
| JP | 2000-164837 | | 6/2000 |
| JP | 2001-196568 | | 7/2001 |
| KR | 1998-081184 | | 11/1998 |

OTHER PUBLICATIONS

JP 2000-164837; JPO website computer translation.*

* cited by examiner

*Primary Examiner*—Matthew C Landau
(74) *Attorney, Agent, or Firm*—Edwards Angell Palmer & Dodge LLP; George W. Neuner

(57) ABSTRACT

A semiconductor apparatus comprises: a light input/output portion provided in an upper portion of a semiconductor substrate, the light input/output portion having an opening region for light associated to the light input/output portion to pass through; a transparent film covering the opening region; and an interlayer lens provided on the transparent film, the interlayer lens positioned such that an optical axis of the interlayer lens is parallel to a central axis of the opening region.

14 Claims, 4 Drawing Sheets

SEMICONDUCTOR APPARATUS AND METHOD FOR FABRICATING THE SAME

This Nonprovisional application claims priority under 35 U.S.C. §119(a) on Patent Application No. 2003-041791 filed in Japan on Feb. 19, 2003, the entire contents of which are hereby incorporated by reference.

BACKGROUND OF THE INVENTION

1. Field of the Invention

The present invention relates to a semiconductor apparatus and a fabrication method thereof, more particularly, a semiconductor apparatus, for example, a solid-state image pickup device such as a charge coupled device (CCD) including interlayer lenses, a liquid crystal display device, and the like, and a fabrication method thereof.

2. Description of the Related Art

A metal oxide semiconductor (MOS) type solid-state image pickup device such as a CCD is used in an electronic information tool for various applications such as a digital camera, a video camera, a cell phone with a built-in camera, a scanner, a digital copying machine, a facsimile, and the like.

As electronic information tools, including a semiconductor apparatus such as a solid-state image pickup device, becomes popular in the market, there is a growing demand for a solid-state image pickup device with small size and low cost, as well as enhanced functions and high performances, for example, a large number of pixels, an improved light-receiving sensitivity or the like.

In order to meet such a demand, the size of the solid-state image pickup device is reduced and the pixels are formed with a high density. As this continues, the size of each of the pixels incorporated into the solid-state image pickup device will be reduced. As a result, a light-receiving sensitivity of the solid-state image pickup device may be deteriorated and the high light-receiving sensitivity, i.e., one of the basic performances of the solid-state image pickup device, cannot be achieved. It may be difficult to shoot a sharp image at a certain illuminance.

As a resolution for such a problem, for example, Japanese Laid-Open Publication No. 4-12568 discloses a solid-state image pickup device having a microlens formed of an organic high polymer material on a color filter in order to improve the light-receiving sensitivity. Japanese Laid-Open Publication Nos. 2000-164837 and 11-40787 disclose a solid-state image pickup device having a microlens formed on a color filter and also an interlayer lens formed in a laminate structure provided between the color filter and a light-receiving portion to further improve the light-receiving sensitivity.

Hereinafter, an example of a conventional CCD solid-state image pickup device having interlayer lenses will be described.

FIG. 4 is a schematic cross-sectional view of a pixel 250 of a conventional CCD solid-state image pickup device 200.

Note that, although the CCD solid-state image pickup device 200 includes a plurality of the pixels 250, only one pixel is shown in the figures for the sake of clarity.

In the CCD solid-state image pickup device 200 shown in FIG. 4, charge transferring portions, i.e., a plurality of CCD transfer channels 104 are provided in an upper portion of a semiconductor substrate 101 with predetermined spaces therebetween. In the spaces between the CCD transfer channels 104 next to each other, a plurality of light receiving portions 102 having a photoelectric conversion function are buried with appropriate spaces from the CCD transfer channels 104. Between the light receiving portions 102 corresponding to pixels 250 and the CCD transfer channels 104 on one side, readout gate portions 103 are respectively provided. Between the light receiving portions 102 and the CCD transfer channels 104 on the other side, channel stopper portions 105 are respectively buried.

In the upper portion of the semiconductor substrate 101, one light receiving portion 102 and the CCD transfer channel 104 with the readout gate portion 103 interposed therebetween are separated from another light receiving portion 102 of an adjacent pixel 250 and the CCD transfer channel 104 by the channel stopper portion 105. An insulating film 106 is provided across the entire surface of the semiconductor substrate 101, covering the light receiving portions 102, the CCD transfer channels 104, the readout gate portions 103, and the channel stopper portions 105.

A transfer electrode 107 is provided on the insulating film 106 for each of the CCD transfer channels 104. The transfer electrodes 107 are covered with interlayer insulating films 108. On the insulating film 106, a light shield film 109 is provided so as to cover the interlayer insulating films 108. The light shield film 109 blocks the incidence of light onto the transfer electrodes 107.

The light shield film 109 includes: portions 109a which are respectively provided above portions of the CCD transfer channels 104 closer to the readout gate portions 103; portions 109b which are respectively provided above the readout gate portions 103 and above portions of the light receiving portions 102 closer to the readout gate portions 103 and which contact the insulating film 106; portions 109c which are respectively provided above the channel stopper portions 105 and above portions of the light receiving portions 102 closer to the channel stopper portion 105 and which contacts the insulating film 106; and portions 109d which are respectively provided above portions of the CCD transfer channels 104 closer to the channel stopper portions 105.

In regions between the transfer electrodes 107 next to each other, the portions 109b and the portions 109c directly contact the flat insulating film 106.

In the light shield film 109, the portions 109a and the portions 109b have a difference in levels of height and form step portions, and the portions 109c and the portions 109d have a difference in levels of height and form step portions.

The light shield film 109 has openings 109x. Each of the openings 109x corresponds to portions of the light receiving portions 102. The light receiving portions 102 have opening regions 102x. In the openings 109x, the opening regions 102x of the light receiving portions 102 are exposed via the insulating film 106. Light impinges on the opening regions 102x of the light receiving portions 102 through the openings 109x provided in the light shield film 109.

A first flattening film 110 formed of a boro-phospho silicate glass (BPSG) film is provided on the light shield film 109 by, for example, a normal-pressure CVD process. The first flattening film 110 has a surface shape which corresponds to a shape of the light shield film 109. The portions of the surface above the light receiving portions 102 are concaved.

A lens forming layer 111 formed of a high-refractive-index material such as a silicon nitride film is provided on the first flattening film 110. Interlayer lenses 111a are respectively provided in the concave portions of the first flattening film 110. The interlayer lenses 111a are located above the light receiving portions 102. Each of the interlayer lenses 111a has a lens surface of a convex shape protruding downward on the lower side and also has a lens surface of a convex shape protruding upward on the upper side. The lens forming layer 111 is flattened except for the portions where the interlayer lenses 111a are provided.

A second flattening film 112 formed of a low-refractive-index material is provided on the lens forming layer 111. A surface of the second flattening film 112 is flattened. A color filter 113 and a protection film 114 of a uniform thickness are sequentially provided on the second flattening film 112.

A plurality of microlenses 115 for converging incidence light to the opening regions 102x of the light receiving portions 102 are provided on the protection film 114 so as to respectively correspond to the light receiving portions 102. Each of the microlenses 115 is a convex lens having the upper surface protruding upward such that the center portion is thicker than the peripheral portion. Each of the microlenses 115 is located so as to cover a corresponding light receiving portion 102, and portions of the CCD transfer channels 104 provided on both sides of the light receiving portion 102.

Next, a method for fabricating a conventional CCD solid-state image pickup device 200 shown in FIG. 4 will be described.

FIGS. 5A through 5E are cross-sectional views respectively showing the steps in the method for fabricating a conventional CCD solid-state image pickup device 200.

With reference to FIG. 5A, required impurities are added to the semiconductor substrate 101 by an ion implantation or the like. Thus, a plurality of the CCD transfer channels 104 are formed in an upper portion of the semiconductor substrate 101 with predetermined spaces therebetween. Also, the light receiving portions 102 are respectively provided between the CCD transfer channels 104 with appropriate spaces therefrom in the upper portion of the semiconductor substrate 101. Further, the channel stopper portions 105 are respectively formed between the light receiving portions 102 and the CCD transfer channels 104 on one side. Regions between the light receiving portions 102 and the CCD transfer channels 104 on the other side function as the readout gate portions 103. One light receiving portion 102 and the CCD transfer channel 104 with the readout gate portion 103 interposed therebetween are formed in the upper portion of the semiconductor substrate 101 being separated from another light receiving portion 102 of an adjacent pixel 250 and the CCD transfer channel 104 by the channel stopper portion 105.

Next, the insulation film 106 formed of, for example, $SiO_2$ or the like, is formed on a surface of the semiconductor substrate 101 by a thermal oxidation process or a CVD process.

Then, a polysilicon film, for example, is formed on the insulating film 106 by a CVD process. The formed polysilicon film is patterned by photolithography or etching to form transfer electrodes 107 formed of the polysilicon film such that they respectively correspond to the CCD transfer channels 104. Then, the interlayer insulating films 108 formed of, for example, $SiO_2$ or the like, are formed by a CVD process and so on so as to respectively cover the transfer electrodes 107.

Next, the light shield film 109 formed of a high-melting-point metal such as titanium (Ti), tungsten (W), or the like, is formed by a sputtering process so as to cover the transfer electrodes 107 covered by the interlayer insulating films 108 and the insulating film 106 between the transfer electrodes 107 next to each other. As described above, the light shield film 109 includes the portions 109a, the portions 109b, portions 109c and the portions 109d. The step portions are formed between the portions 109a and the portions 109b and the step portions are formed between the portions 109c and the portions 109d.

Then, the light shield film 109 formed of a high-melting-point metal is patterned by photolithography and etching. Thus, the openings 109x are formed to respectively correspond to the regions of the light receiving portions 102.

Next, with reference to FIG. 5B, the BPSG film having phosphorous (P) and boron (B) of a predetermined concentration is deposited by, for example, a normal-pressure CVD process on the light shield film 109 having the openings 109x. Then, a reflow process is performed under a high temperature of 900° C. or higher. Thus, the first flattening film 110 formed of the BPSG film is formed. The portions of the surface of the first flattening film 110, i.e., the BPSG film, are concaved where the openings 109x are provided above the light receiving portions 102 due to the step portions in the light shield film 109.

Next, with reference to FIG. 5C, the lens forming layer 111 formed of a high-refractive-index material such as a silicon nitride film is formed on the first flattening film 110 by, for example, a plasma CVD process. A surface of the lens forming layer 111 is flattened.

Next, a resist 117 is applied on the lens forming layer 111 to have a predetermined thickness. The resist 117 is patterned so as to be left at a position corresponding to the light receiving portion 102 and the portions around the light receiving portion 102. Then, a reflow process is performed, for example, at a temperature around 160° C. Accordingly, as shown in FIG. 5D, the resists 117 have convex-lens shapes protruding upward such that the central portion is thicker than the peripheral portion.

Next, using the resists 117 of convex-lens shapes as a mask, the lens forming layer 111 is etched by dry-etching. By setting an appropriate selective etching ratio for the resists 117 and the lens forming layer 111, the surface of the lens forming layer 111 is etched to have a convex-lens shape protruding upward similarly to the resists 117 of convex-lens shapes as shown in FIG. 5E. Thus, the interlayer lenses 111a are formed in the positions opposing the light receiving portions 102. Each of the interlayer lenses 111a has a lens surface of a convex shape protruding downward on the lower side and also has a lens surface of a convex shape protruding upward on the upper side. The lens forming layer 111 is flattened and has a predetermined thickness except for the portions where the interlayer lenses 111a are formed.

On the lens forming layer 111 provided with the interlayer lenses 111a, a second flattening film 112 formed of a low-refractive-index material is formed in order to improve the converging rate of the interlayer lenses 111a. The second flattening film 112 is formed so as to cover the lens forming layer 111 and a surface thereof is flattened (see FIG. 4).

Then, a color filter 113 and a protection film 114 of a predetermined thickness are sequentially provided on the second flattening film 112. A plurality of microlenses 115 for converging incidence light to the light receiving portions 102 are provided on the protection film 114. Each of the microlenses 115 is formed at a position opposing one light receiving portion 102, and portions of the CCD transfer channels 104 provided on both sides of the light receiving portion 102 (see FIG. 4). The microlenses 115 are formed to have a shape of a convex lens having the upper surface protruding upward such that the center portion is thicker than the peripheral portion.

In this way, the CCD solid-state image pickup device 200 shown in FIG. 4 is obtained.

In such a method for fabricating the CCD solid-state image pickup device 200, as described above with respect to FIG. 5B, the BPSG film including boron (B) and phosphorous (P) is processed with there flow process under high temperature. When such a process is performed, the surface of the first flattening film 110 is concaved by using the step portions in the light shield film 109. The lens surfaces on the lower side of the interlayer lenses 111a are formed corresponding to the concaved surface of the first flattening film 110. Thus, the central position of the lens surface of the lower side of an interlayer lens 111a may be undesirably deviated from the central axis of the corresponding opening region 102x, i.e., the central axis of the corresponding opening 109x.

The details will be explained below.

In the light shield film 109, the portions 109b of the light shield film 109 and the portions 109c of the light shield film 109 both overlay the corresponding light receiving portions 102. However, the lengths of the portions 109b are different from those of the portions 109c. For example, in the case of the CCD solid-state image pickup device 200, the portions 109c of the light shield film 109 are usually longer than the portions 109b of the light shield film 109 in order to securely block the channel stopper portions 105 from the light. Accordingly, the portions 109b and the portions 109c are formed in asymmetrical positions with respect to the central portion of the light receiving portions 102.

The central line A-A' runs through the center C of each of the concaved portions on the surface of the first flattening film 110 after the reflow process which is decided based on the positions of the step portions between the portions 109a and portions 109b of the light shield film 109 and the step portions between the portions 109c and portions 109d of the light shield film 109. The central axis B-B' runs through the central portion of the corresponding opening 109x above the light receiving portion 102. The central line A-A' is not aligned with the central axis B-B'. The center C' of the lens surface on the upper side of each of the interlayer lenses 111a is formed so as to align with the central axis B-B' running through the central axis of each of the openings 109x, i.e., that of each of the opening regions 102x.

Therefore, the optical axis of each of the interlayer lenses 111a, i.e., the line connecting the center C of each of the lens surface on the lower side of each of the interlayer lenses 111a and the center C' of the lens surface on the upper side of each of the interlayer lenses 111a is not aligned with the central axis of the corresponding opening region 102x nor is parallel thereto. As a result, the light converged by the interlayer lenses 111a does not pass through the openings 109x efficiently. The amount of light received by the light receiving portions 102 may decrease. The desirable light receiving sensitivity may not be obtained for the CCD solid-state image pickup device 200.

In the method described above, the BPSG film is subjected to the reflow process under high temperature, and the lens surfaces of the convex-shape protruding downward on the lower side of the interlayer lenses 111a are defined based on the concaved portions on the surface of the first flattening film 110. Such a method has a further problem that lens surfaces of the convex-shape on the lower side of the interlayer lenses 111a may not be stably and uniformly formed. More specifically, the lens surfaces on the lower side of the interlayer lenses 111a are defined by the concaved surface of the first flattening film 110, including the BPSG film which is subjected to there flow process under the high temperature. Thus, the lens surfaces on the lower side of the interlayer lenses 111a depend on the concentrations of boron (B) and phosphorous (P) in the BPSG film, the temperature for the reflow process, and the feature of the underlying surface of the light shield film 109 having the step portions. As a result, the converging rate of the interlayer lenses 111a may decrease, causing deterioration in the image quality of the CCD solid-state image pickup device 200.

SUMMARY OF THE INVENTION

According to one aspect of the present invention, there is provided a semiconductor apparatus comprising: a light input/output portion provided in an upper portion of a semiconductor substrate, the light input/output portion having an opening region for light associated to the light input/output portion to pass through; a transparent film covering the opening region; and an interlayer lens provided on the transparent film, the interlayer lens positioned such that an optical axis of the interlayer lens is parallel to a central axis of the opening region.

In one embodiment of the present invention, the light input/output portion includes a light receiving portion for receiving light.

In one embodiment of the present invention, the transparent film is provided with step portions so as to have a concaved surface, and a concaved portion cover the opening region.

In one embodiment of the present invention, the optical axis of the interlayer lens is aligned with the central axis of the opening region.

In one embodiment of the present invention, a refractive index of the transparent film is lower than a refractive index of the interlayer lens.

In one embodiment of the present invention, the transparent film includes a silicon oxide film including at least one of phosphorous (P) and boron (B).

In one embodiment of the present invention, the transparent film includes an organic high polymer film.

In one embodiment of the present invention, the transparent film is formed by patterning using selective etching.

In one embodiment of the present invention, the transparent film is formed by a thermal process after the patterning.

In one embodiment of the present invention, the semiconductor apparatus further comprises: a transfer channel provided so as to have a predetermined space from the light input/output portion; an insulating film provided on the semiconductor substrate, the light input/output portion and the transfer channel; a transfer electrode provided so as to oppose the transfer channel via the insulating film; and an insulating film provided with an opening for exposing the opening region of the light input/output portion and in which step portions are produced by covering the transfer electrode.

In one embodiment of the present invention, the optical axis of the interlayer lens is aligned with the central axis of the opening.

According to another aspect of the present invention, there is provided a method for fabricating a semiconductor apparatus comprising: forming a light input/output portion having an opening region for passing through associated light in an upper portion of a semiconductor substrate, forming a transparent film so as to cover the opening region; and forming an interlayer lens provided on the transparent film, the interlayer lens being formed such that an optical axis of the interlayer lens is parallel to a central axis of the opening region.

In one embodiment of the present invention, forming the light input/output portion includes forming a light receiving portion for receiving light as the light input/output portion.

In one embodiment of the present invention, a method for fabricating a semiconductor apparatus further comprises forming a light shield film provided with an opening for exposing the opening region of the light input/output portion.

In one embodiment of the present invention, forming the interlayer lens includes forming the interlayer lens such that the optical axis of the interlayer lens is aligned with the central axis of the opening region.

In one embodiment of the present invention, forming the transparent film includes selectively etching and patterning the transparent film.

In one embodiment of the present invention, forming the transparent film includes performing a thermal process after patterning.

In one embodiment of the present invention, forming the transparent film includes flattening a surface of the transparent film before the step of patterning.

The functions of the above-described structure are as follows.

The semiconductor apparatus according to the present invention has the optical axes of the interlayer lenses parallel to the central axes of the opening regions of the light input/output portions, and thus, the light input/output portions efficiently utilize the interlayer lenses.

According to one embodiment of the present invention, although the light shield film which is provided to cover a non-planar surface has step portions, the light receiving portions can efficiently receive the light converged by the interlayer lenses without being affected by the step portions.

Thus, the invention described herein makes possible the advantages of: (1) providing a semiconductor apparatus in which light input/output portions efficiently utilize interlayer lenses, and a method for fabricating the same; and (2) a semiconductor apparatus in which interlayer lenses can be stably fabricated to improve the efficiency of the interlayer lenses, and a method for fabricating the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, an embodiment of the present invention will be described with reference to the figures.

The following description will be made with respect to a CCD solid-state image pickup device. However, this is an example of a semiconductor apparatus and the present invention is not limited to this. The semiconductor apparatus according to the present invention includes, for example, other types of solid-state image pickup device such as a MOS type solid-state image pickup device, a liquid crystal display device, and the like.

Figure 1:
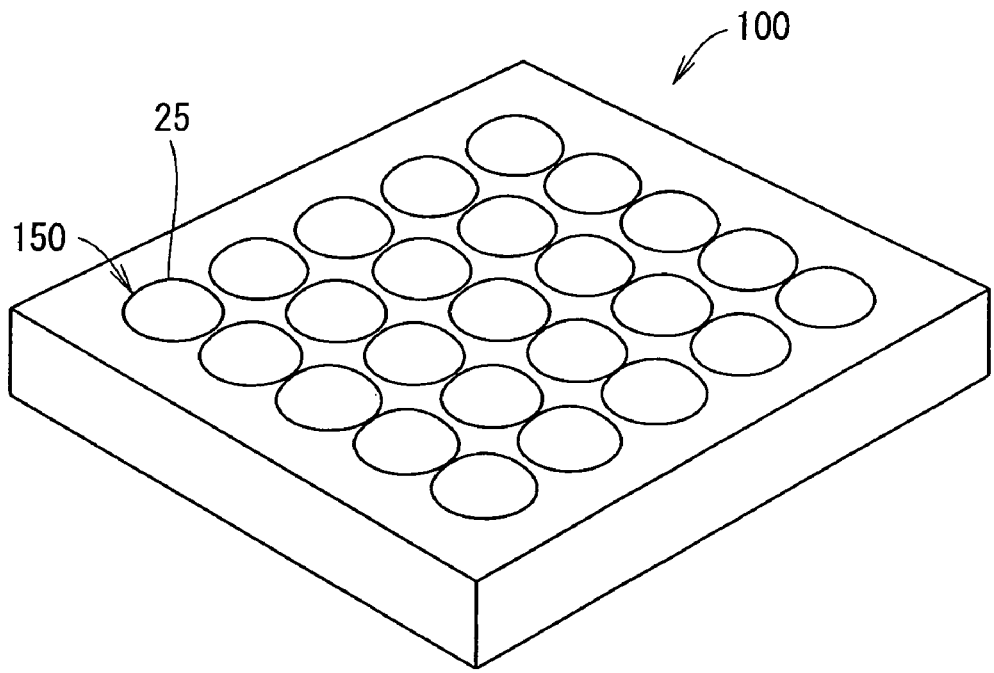
FIG. 1 is a schematic perspective view of a CCD solid-state image pickup device according to an embodiment of the present invention.

FIG. 1 is a schematic perspective view of a CCD solid-state image pickup device 100 according to one embodiment of the present invention.

The CCD solid-state image pickup device 100 includes a plurality of pixels 150. The plurality of pixels 150 are arranged along a row direction and a column direction into a matrix.

Microlenses 25 are respectively provided on surfaces of the pixels 150. The light that passes through the microlenses 25 is detected.

Figure 2:
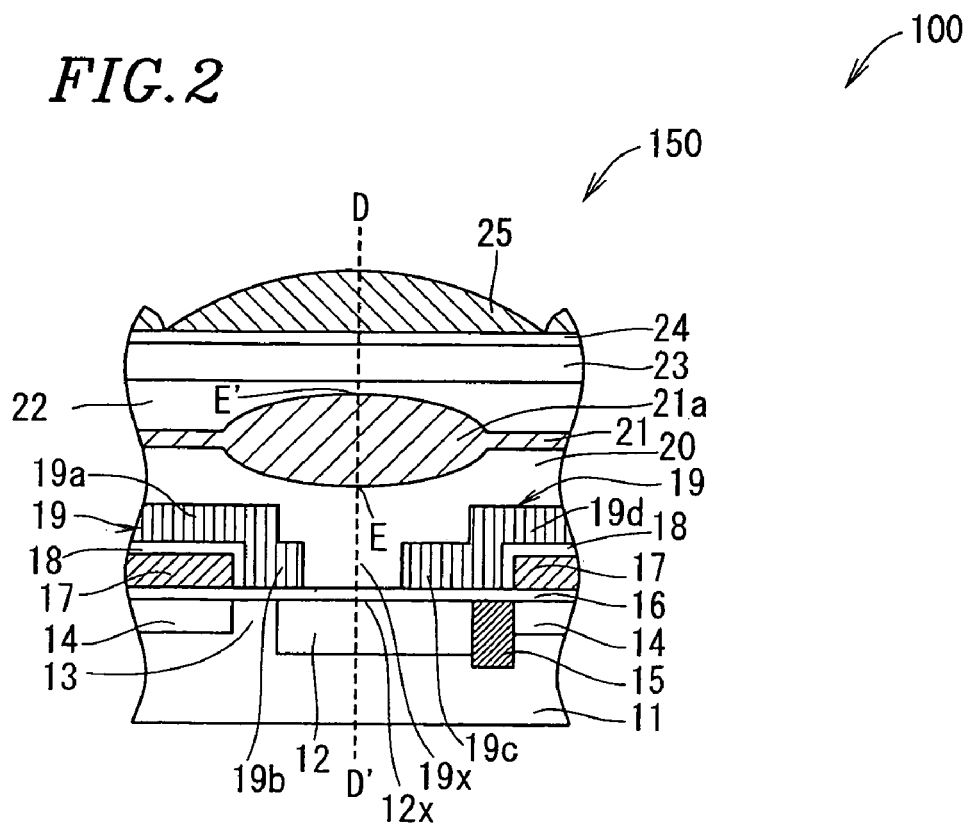
FIG. 2 is a schematic cross-sectional view of one of the pixels of the CCD solid-state image pickup device according to the embodiment of the present invention.

FIG. 2 is a schematic cross-sectional view of the pixel 150 of the CCD solid-state image pickup device 100 shown in FIG. 1.

Note that, although FIG. 2 shows only one pixel 150 of the CCD solid-state image pickup device 100 for the sake of clarity, other pixels 150 have the same structure.

In the CCD solid-state image pickup device 100 shown in FIG. 2, charge transferring portions, i.e., a plurality of CCD transfer channels 14 are buried in an upper portion of a semiconductor substrate 11 with predetermined spaces therebetween. In the spaces between the CCD transfer channels 14 next to each other, a plurality of light receiving portions 12 having a photoelectric conversion function are buried with an appropriate space from the next CCD transfer channel 14. The light receiving portions 12 respectively correspond to the pixels 150. The light receiving portions 12 are one form of a light input/output portion for inputting light or outputting light.

Between the light receiving portions 12 and the CCD transfer channels 14 on one side of the light receiving portions 12, readout gate portions 13 are respectively provided in the upper portion of the semiconductor substrate 11. Between the light receiving portions 12 and the CCD transfer channels 14 on the other side of the light receiving portions 12, channel stopper portions 15 are respectively buried in the upper portion of the semiconductor substrate 11. In the upper portion of the semiconductor substrate 11, the light receiving portions 12 are next to the CCD transfer channels 14 on the one side via the readout gate portion 13 and are separated from the CCD transfer channel 14 on the other side by the channel stopper portion 15.

An insulating film 16 having a uniform thickness is provided across the entire surface of the semiconductor substrate 11, covering the light receiving portions 12, the CCD transfer channels 14, the readout gate portions 13, and the channel stopper portions 15. The insulating film 16 includes a transparent material which transmits light.

Transfer electrodes 17 including polysilicon or tungsten silicide are provided on the insulating film 16 so as to respectively oppose the CCD transfer channels 14 provided in the semiconductor substrate 11 via the insulating film 16. The transfer electrodes 17 are covered with interlayer insulating films 18. The interlayer insulating films 18 respectively cover the surfaces of the transfer electrodes 17 and are not provided on the insulating film 16 in regions between the transfer electrodes 17 next to each other.

On the semiconductor substrate 11, a light shield film 19 is provided so as to cover the interlayer insulating films 18 covering the transfer electrodes 17 and the insulating film 16 between the transfer electrodes 17. The light shield film 19 includes tungsten silicide or titanium tungsten. The light shield film 19 blocks the incidence of light onto the transfer electrodes 17.

The light shield film 19 includes: portions 19a which are respectively provided above portions of the CCD transfer channels 14 closer to the readout gate portions 13; portions 19b which are respectively provided above the readout gate portions 13 and above portions of the light receiving portions 12 closer to the readout gate portions 13 and which contact the insulating film 16; portions 19c which are respectively provided above the channel stopper portions 15 and above portions of the light receiving portions 12 closer to the channel stopper portions 15 and which contact the insulating film 16; and portions 19d which are respectively provided above portions of the CCD transfer channels 14 closer to the channel stopper portion 15.

In regions between the transfer electrodes 17 next to each other, the portions 19b and the portions 19c directly contact the flat insulating film 16.

In the light shield film 19, the portions 19a and the portions 19b have a difference in levels of height and form step portions, and the portions 19c and the portions 19d have a difference in levels of height and form step portions. Accordingly, a surface of the light shield film 19 provided on the light receiving portions 12 have a concaved shape.

The light shield film 19 provided on the light receiving portions 12 has openings 19x. Each of the openings 19x corresponds to portions of the light receiving portions 12. The light receiving portions 12 have opening regions 12x. In the openings 19x, the opening regions 12x of the light receiving portions 12 are exposed via the insulating film 16. Light passes through the openings 19x and impinges on the opening regions 12x of the light receiving portions 12 via the insulating film 16.

In the light shield film 19, the portions 19b of the light shield film 19 and the portions 19c of the light shield film 19 both overlay the corresponding light receiving portions 12. However, the lengths of the portions 19b are different from those of the portions 19c. In this example, the portions 19c of the light shield film 19 are longer than the portions 19b of the light shield film 19.

More specifically, in regions between the readout gate portions 13 and the channel stopper portions 15 which are adjacent to the light receiving portions 12, the central axes of the opening regions 12x, i.e., the central axes of the openings 19x are respectively closer to the readout gate portions 13 than to the channel stopper portions 15.

Thus, portions of the light receiving portions 12 closer to the adjacent channel stopper portions 15 are blocked by the light shield film 19 compared to the portions closer to the adjacent readout gate portions 13.

On the light shield film 19 and in the openings 19x provided on the light shield film 19, a transparent film 20 is provided.

The transparent film 20 includes a silicon oxide film including at least one of phosphorous (P) and boron (B). The transparent film 20 includes, for example, a boro-phospho silicate glass (BPSG) film formed by a normal-pressure CVD process. An organic high polymer film may be used as the transparent film 20. On a surface of the transparent film 20, portions concaved into arc shapes are respectively provided so as to correspond to concave-shaped portions of the light shield film 19 provided above the light receiving portions 12.

A lens forming layer 21 including a high-refractive-index material such as a silicon nitride film is provided on the transparent film 20. In the lens forming layer 21, interlayer lenses 21a are provided above the portions concaved into arc shapes of the transparent film 20. Each of the interlayer lenses 21a has a convex lens shape having lens surfaces protruding to have arc shapes on both the upper side and the lower side. The optical axis connecting the center E' of the upper surface and the center E of the lower surface is aligned with the central axis D-D' of the corresponding opening 19x on the light receiving portion 12 (a line perpendicular to the semiconductor substrate 11 running through the center of the corresponding opening 19x). In other words, the optical axis of each of the interlayer lenses 21a is aligned with the central axis of the corresponding opening region 12x of the light receiving portion 12.

The lens forming layer 21 is flattened except for the portions where the interlayer lenses 21a are formed. The refractive index of the lens forming layer 21 is higher than that of the transparent film 20.

As described above, the optical axes of the interlayer lenses 21a are respectively aligned with the central axes of the opening regions 12x. Accordingly, the converging rate of the light which passes through the openings 19x and is received by the light receiving portions 12 which reside below increases, and thus, the amount of light received by the light receiving portions 12 increases.

In the present example, the optical axes of the interlayer lenses 21a are respectively aligned with the central axes of the opening regions 12x. However, the present invention is not limited to this. Optionally, the optical axes of the interlayer lenses 21a may be deviated to a desired direction by a desired amount by using an offset such that the optical axes of the interlayer lenses 21a are respectively parallel with the central axes of the opening regions 12x.

A flattening film 22 including a low-refractive-index material is provided on the lens forming layer 21 with a uniform thickness. A surface of the flattening film 22 is flattened. A color filter 23 and a protection film 24 of a uniform thickness are sequentially provided on the flattening film 22.

A plurality of microlenses 25 are provided on the protection film 24 so as to respectively correspond to the interlayer lenses 21a. The microlenses 25 converge incidence light to the light receiving portions 12 and improve the converging rate of the interlayer lenses 21a. Each of the microlenses 25 has a convex lens shape having the upper surface protruding into an arc shape such that the center portion is thicker than the peripheral portion. The microlens 25 has an optical axis aligned with the optical axis of the corresponding interlayer lens 21a. The microlens 25 covers the corresponding light receiving portion 12, and portions close to the light receiving portion 12. The microlenses 25 next to each other are closely provided to each other.

In the CCD solid-state image pickup device 100, when the microlenses 25 are irradiated with light, the light is converged by the microlenses 25. The converged light is applied to the interlayer lenses 21a which reside below and further converged by the interlayer lenses 21a. Then, the light passes through the openings 19x provided in the light shield film 19 and is applied to the opening regions 12x of the light receiving portions 12.

In this case, the optical axes of the interlayer lenses 21a are respectively aligned with the central axes of the openings 19x which reside below, i.e., the central axes of the opening regions 12x of the light receiving portions 12. Thus, the light converged by the interlayer lenses 21a is efficiently applied into the openings 19x. Thus, the light is efficiently received by the light receiving portions 12.

When the light receiving portions 12 receive the light, electrons are generated by a photoelectric conversion. The electrons are transferred to the CCD transfer channels 14 via the readout gate portions 13 by applying a voltage to the transfer electrodes 17. Then, signals according to the amount of the electrons are output from the CCD transfer channels 14.

As described above, the CCD solid-state image pickup device 100 of a high sensitivity and a high image quality can be achieved by the converging effects of the microlenses 25 and the interlayer lenses 21a.

Next, a method for fabricating a CCD solid-state image pickup device 100 according to one embodiment of the present invention will be described.

FIGS. 3A through 3E are cross-sectional views respectively showing the steps in the method for fabricating the CCD solid-state image pickup device 100 according to one embodiment of the present invention.

Figure 3A:
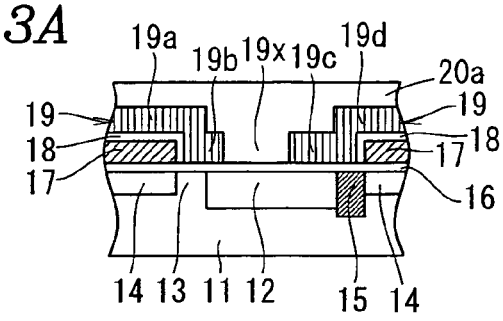
FIGS. 3A through 3E are cross-sectional views respectively showing the steps in the method for fabricating the CCD solid-state image pickup device according to the embodiment of the present invention.

With reference to FIG. 3A, required impurities are added to the semiconductor substrate 11 by an ion implantation or the like. Thus, a plurality of the CCD transfer channels 14 are formed in the upper portion of the semiconductor substrate 11 with predetermined spaces therebetween. Also, the light receiving portions 12 are respectively provided between the CCD transfer channels 14 with appropriate spaces therefrom in the upper portion of the semiconductor substrate 11. Further, the channel stopper portions 15 are formed between the light receiving portions 12 and the CCD transfer channels 14 next to one side of the respective light receiving portions 12. Regions between the light receiving portions 12 and the CCD transfer channels 14 on the other side function as the readout gate portions 13. One light receiving portion 12 and the CCD transfer channel 14 with the readout gate portion 13 interposed therebetween are formed in the upper portion of the semiconductor substrate 11 being separated from another light receiving portion 12 of an adjacent pixel 250 and the CCD transfer channel 14 by the channel stopper portion 15.

Next, the insulation film 16 including, for example, $SiO_2$ or the like, is formed on a surface of the semiconductor substrate 11 by a thermal oxidation process or a CVD process.

Then, a polysilicon film or the like is formed on the insulating film 16 by a CVD process or the like. Alternately, a tungsten silicide film or the like is formed on the insulating film 16 by a sputtering process or the like.

The formed polysilicon film or tungsten silicide is patterned by photolithography or etching to form transfer electrodes 17 including the polysilicon film or tungsten silicide such that they respectively correspond to the CCD transfer channels 14. Then, the interlayer insulating films 18 including, for example, $SiO_2$ or the like, are formed by a CVD process or the like so as to respectively cover the transfer electrodes 17.

Next, the light shield film 19 including a high-melting-point metal such as tungsten silicide, titanium tungsten (TiW), or the like, is formed by a sputtering process or the like, so as to cover the transfer electrodes 17 covered by the interlayer insulating films 18 and the insulating film 16 between the transfer electrodes 17 next to each other. As described above, the light shield film 19 includes the portions 19a, the portions 19b, the portions 19c and the portions 19d. The step portions are formed between the portions 19a and the portions 19b and the step portions are formed between the portions 19c and the portions 19d.

Then, the light shield film 19 including a high-melting-point metal is patterned by photolithography and etching. Thus, the openings 19x are formed to correspond to the regions of the light receiving portions 12.

As described above, the portions 19c of the light shield film 19 are longer than the portions 19b of the light shield film 19 so as to securely block the channel stopper portions 15 from the light.

Next, the BPSG film having phosphorous (P) and boron (B) of a predetermined concentration is deposited by, for example, a normal pressure CVD process on the light shield film 19 and in the openings 19x provided in the light shield film 19. The BPSG film is deposited so as to have the thickness of 900 nm. The concentration of boron (B) is set to be 4.2 wt %, and the concentration of phosphorous (P) is set to be 4.9 wt % in order to achieve a flat surface of the BPSG film upon a reflow process. Then, the reflow process is performed under 950° C. for 20 minutes. Thus, the transparent film 20a of the BPSG film having a flat surface is formed.

In order to achieve the sufficiently flattened surface of the transparent film 20a by the above reflow process, the transparent film 20a including the BPSG film having a desirable thickness may be formed as follows. For example, a thick BPSG film is deposited on the light shield film 19 and in the openings 19x provided in the light shield film 19 beforehand, and the reflow process is performed. Then, the entire surface of the BPSG film is etched back by, for example, plasma etching to improve flatness of the surface of the BPSG film.

Figure 3B:
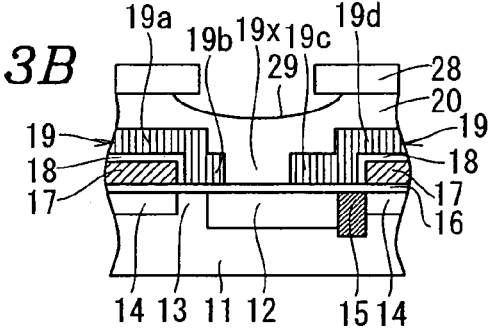

Next, a photoresist having a thickness of 1.0 µm is applied on the transparent film 20a by a spin coater and dried for two minutes by a hot plate at 90° C. Then, the photoresist is patterned using a photolithography technique which is usually used in semiconductor processing steps. As shown in FIG. 3B, resist patterns 28 are formed on the transparent film 20a corresponding to the light receiving portions 12 at predetermined positions so as to surround the regions in which the interlayer lenses are to be formed. The resist patterns 28 are formed such that the optical axes of the interlayer lenses to be formed and the central axes of the openings 19x on the insulating film 16 corresponding to the light receiving portions 12, i.e., the central axes of the opening regions 12x are aligned.

Then, a drying step by using a hot plate at a temperature of 120° C. is performed for two minutes. Plasma etching is performed using the resist patterns 28 as a mask. Only portions of a surface of the transparent film 20a in which the resist patterns 28 are not provided are selectively etched. Thus, the transparent film 20 is formed with lens-shaped patterns 29 having convex-lens shapes protruding downward into arc shapes in portions of a surface of the transparent film 20a respectively corresponding to the light receiving portions 12. An organic high polymer film may be used for the transparent film 20. The lens-shaped patterns 29 are formed such that the optical axes running through the center of the lens-shaped patterns 29 are aligned with the central axes of the openings 19x corresponding to opening regions 12x of the light receiving portions 12. In this case, the conditions of the plasma etching are as follows: $SF_6$ is used as etching gas, RF power is 250 W, pressure is 53 Pa, and the temperature is 100° C.

After the plasma etching process, the resist patterns 28 are removed with a method used in usual semiconductor processing steps. Optionally, a thermal process at a high temperature may be performed again for thermal deforming the lens-shaped patterns 29.

Figure 3C:
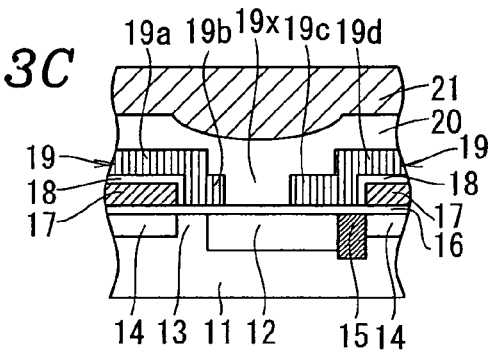

Next, with reference to FIG. 3C, the lens forming layer 21 having a thickness of 900 nm and including a high-refractive-index material such as a silicon nitride film is formed on the transparent film 20 by, for example, a plasma CVD process. A surface of the lens forming layer 21 is flattened.

Figure 3D:
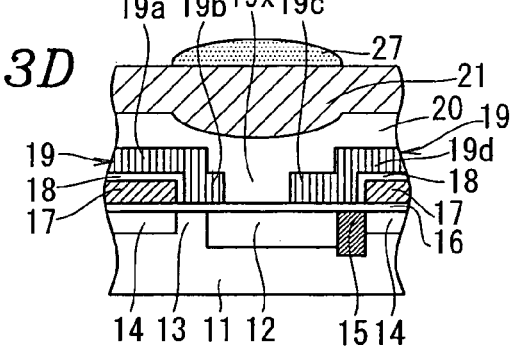

Next, a resist 27 is applied on the lens forming layer 21 to have a predetermined thickness. The resist 27 is patterned by photolithography so as to be left at positions corresponding to the lens-shaped patterns 29 above the light receiving portions 12. Then, a reflow process is performed, for example, at a temperature of 150° C. Accordingly, as shown in FIG. 3D, the resists 27 have convex-lens shapes protruding upward into arc shapes such that the central portion is thicker than the peripheral portion, respectively opposing the lens-shaped patterns 29 above the light receiving portions 12.

Figure 3E:
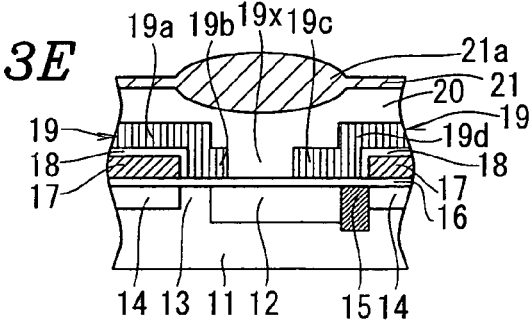
Figure 4:
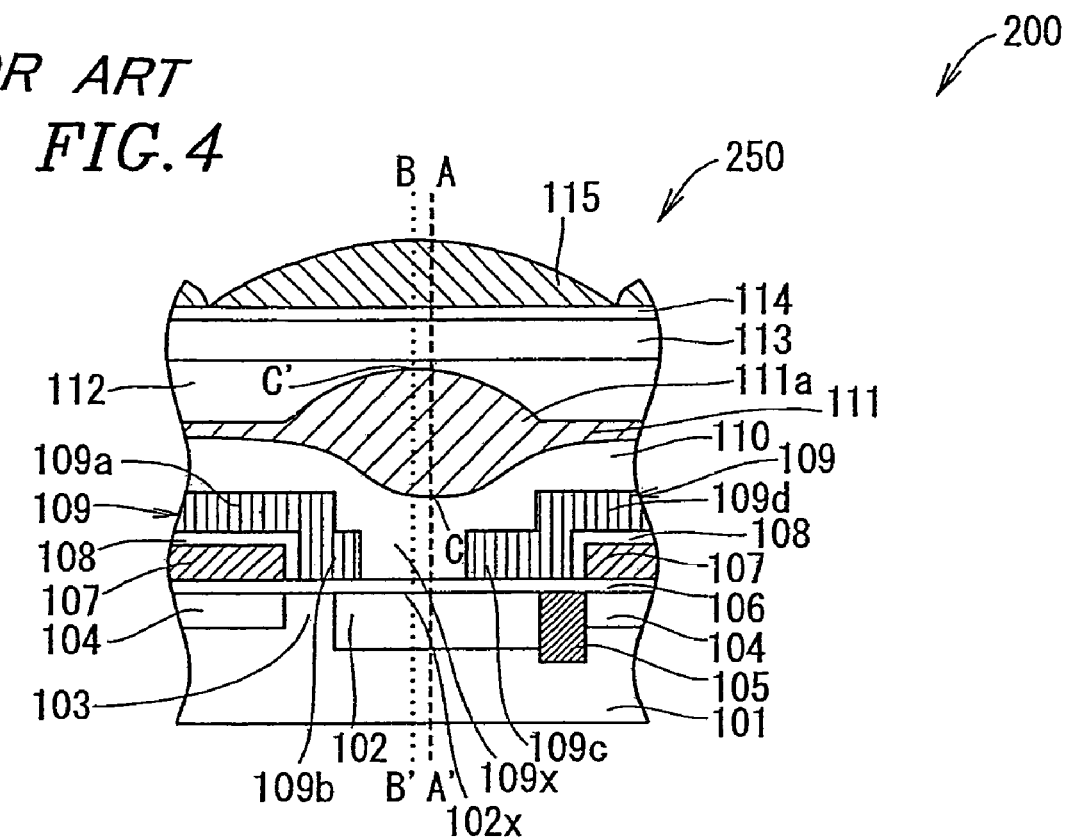
FIG. 4 is a schematic cross-sectional view of one of the pixels of a conventional CCD solid-state image pickup device.
Figure 5A:
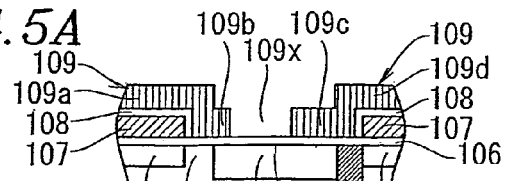
FIGS. 5A through 5E are cross-sectional views respectively showing the steps in the method for fabricating the conventional CCD solid-state image pickup device.
Figure 5B:
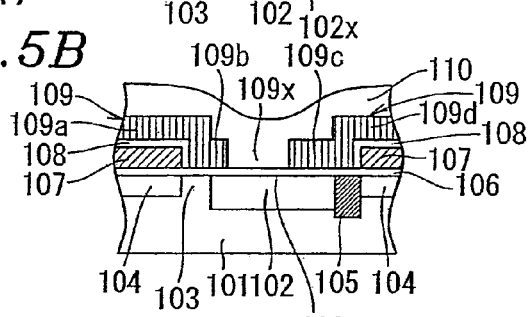
Figure 5C:
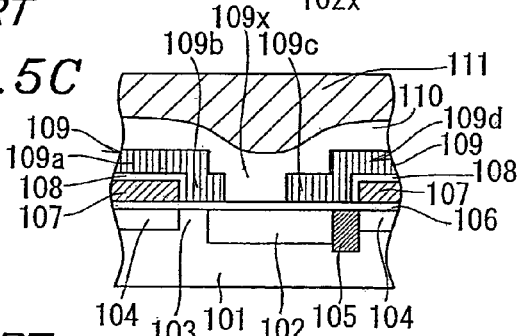
Figure 5D:
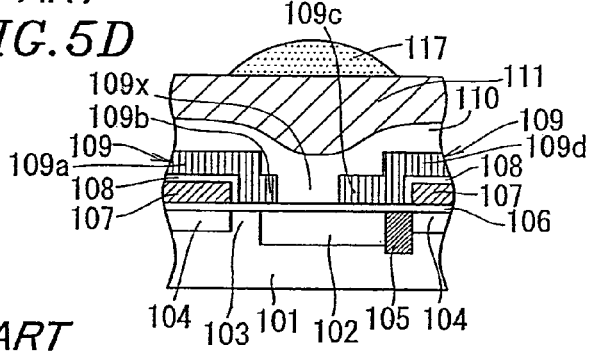
Figure 5E:
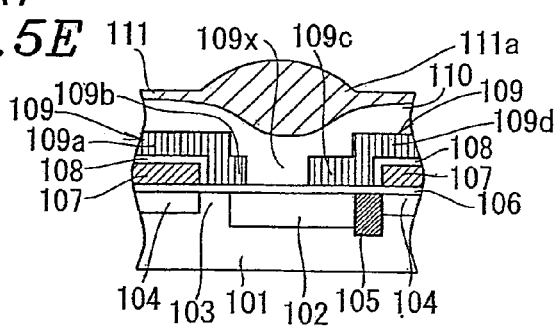

Next, using the resists 27 of a convex-lens shape as a mask, the lens forming layer 21 is etched by dry-etching. By setting an appropriate selective etching ratio for the resists 27 and the lens forming layer 21, the surface of the lens forming layer 21 is etched to have a convex-lens shape protruding upward similarly to the resists 27 of convex-lens shapes as shown in FIG. 3E. Thus, the interlayer lenses 21a are formed in the positions opposing the light receiving portions 12. Each of the interlayer lenses 21a has a lens surface of a convex-lens shape protruding downward on the lower side and also has a lens surface of a convex-lens shape protruding upward on the upper side. As shown in FIG. 2, upper and lower surfaces of each of the interlayer lenses 21a opposing the corresponding light receiving portions 12 form the convex-lens shape having lens surfaces protruding into arc shapes. The optical axis of each of the interlayer lenses 21a connecting the center E' of the upper surface and the center E of the lower surface is aligned with the central axis of the corresponding opening 19x above the light receiving portion 12, i.e., the central axis of the opening region 12, along the straight line D-D' (see FIG. 2).

As a result, the light converged by the interlayer lenses 21a are efficiently applied into the openings 19x. The light receiving portions 12 receive the light efficiently and the amount of light received by the light receiving portions 12 increases. Thus, a desirable receiving light sensitivity of the CCD solid-state image pickup device 100 can be achieved. The lens forming layer 21 is flattened and has a predetermined thickness except for the portions where the interlayer lenses 21a are formed.

On the lens forming layer 21 provided with the interlayer lenses 21a, a flattening film 22 having the thickness of 1.0 μm and including a low-refractive-index material is formed. The second flattening film 22 is formed so as to cover the lens forming layer 21 and a surface thereof is flattened (see FIG. 2). The flattening film 22 may be a thermosetting acryl resin, for example, OPTMER SS-1151 available from JSR Corporation, or the like.

Then, a color filter 23 is laminated onto the flattening film 22 by applying a negative-type resist with pigments having spectral characteristics for green (G), red (R), and blue (B) dispersed therein, and processing the negative-type resist to have desirable patterns by photolithography such as photo developing or the like (see FIG. 2). On the color filter 23, a protection film 24 having the thickness of 0.7 μm and including a thermosetting acryl resin is laminated by applying a thermosetting acryl resin, for example, OPTMER SS-1151 available from JSR Corporation, or the like.

A plurality of microlenses 25 for converging incidence light to the light receiving portions 12 are provided on the protection film 24. Each of the microlenses 25 is formed at a position opposing the corresponding light receiving portion 12, and extends from the regions of the light receiving portion 12 to the regions above portions of the CCD transfer channels 14 next to the light receiving portion 12 (see FIG. 2). The microlens 25 is formed to have a shape of a convex lens having the upper surface protruding upward such that the center portion is thicker than the peripheral portion.

In this way, the CCD solid-state image pickup device 100 shown in FIG. 2 is obtained.

As the transparent film 20 (shown in FIGS. 2 and 3), the BPSG film or a phosphosilicate glass (PSG) film is commonly used. The film is formed by, for example, a CVD process so as to have the thickness of about 300 to 700 nm and then processed with the reflow process under a high temperature around 900 to 1000° C. to become an insulating film under metal wiring.

In the CCD solid-state image pickup device which is the semiconductor apparatus according to the present invention, the resist patterns 28 patterned to have a desirable pattern by photolithography techniques is used as a mask with respect to the transparent film 20 and selective etching is performed using plasma etching. The lens-shaped patterns 29 having convex lens shapes protruding downward into arc shapes on the lower side of the interlayer lenses 21a, and thus, the central position of each of the lens-shaped patterns 29 is determined. In the case where it is required to have the shape of the lens-shaped patterns 29 much closer to the shape of the convex lens to improve the converging rate at the respective light receiving portions 12, the reflow process at a high temperature may be performed after the selective etching, or a thermal process may be performed under optimal conditions in the steps before or after the selective etching.

In the method for fabricating the CCD solid-state image pickup device which is the semiconductor apparatus according to the present invention, the resist patterns 28 are patterned by the photolithography techniques. Thus, the positions at which the interlayer lenses 21a opposing the light receiving portions 12 are formed are not affected by the feature of the underlying surface such as the step portions between the portions 19a and the portions 19b, and the step portions between the portions 19c and the portions 19d in the light shield film 19. The central positions of the lens-shaped patterns 29, which are to be the lower surfaces of the interlayer lenses 21a, and the central axes of the openings 19x above the light receiving portions 12 are preferably positioned so as to align with the straight line D-D'. Thus, the CCD solid-state image pickup device 100 according to the embodiment of the present invention can achieve the optimal converging rate at the light receiving portions 12. Furthermore, if necessary, the optical axes of the interlayer lenses 21a may deviate in a desired direction by a desired amount by using an offset such that the optical axes of the interlayer lenses 21a are respectively parallel with the central axes of the openings 19x, i.e., the central axes of the opening regions 12x.

As a material for the interlayer lenses 21a, a material having a high refractive index is used for improving the converging rate of the lenses. For example, the silicon nitride film (refractive index=2.0) or a polyimide resin which is an organic material (refractive index=1.6-1.8) may be used by a plasma CVD process. In order to further improve the converging rate of the light receiving portions 12, as illustrated with respect to FIG. 3E, the upper surfaces of the interlayer lenses 21a may formed to be lens surfaces of a convex-lens shape protruding upward into an arc shape so as to correspond to the shapes of the lens-shaped patterns 29.

In the above description, reference is made to the CCD solid image pickup device as the embodiment of the present invention. However, the present invention is not limited to this. The present invention may be applied to, for example, other types of solid-state image pickup device such as a MOS type solid-state image pickup device, a liquid crystal display device, and the like. In such cases, a semiconductor apparatus having a desirable shape can be obtained by defining the thickness and the conditions of forming the interlayer lenses, flattening films, protection films, and microlenses similar to the embodiment described above.

Furthermore, the present invention is not limited to the above-described embodiment but may have various structures without deviating from the scope of the present invention.

A semiconductor substrate used in the present invention may be any semiconductor substrate which is usually used for forming a semiconductor apparatus. For example, a semiconductor substrate including semiconductors such as silicon, germanium or the like, and a compound semiconductor such as SiC, SiGe, GaAs, Al-GaAs and the like may be used. Among the above semiconductor substrates, particularly a silicon substrate is preferably used. The silicon substrate may be doped with impurities of n-type or p-type, or may include one or more n-type or p-type well region.

In the semiconductor substrate described above, the light receiving portions are provided as the light input/output portions. The present invention is not limited to this. The semiconductor substrate may be provided with light emitting portions as the light input/output portions.

The light input/output portions include not only so-called solid image pickup devices such as, CCD and CMOS image sensors, charge modulation devices (CMDs), charge injection devices, bipolar image sensors, photoconductive image sensors, laminated type CCDs, infrared image sensors or the like, but also light receiving devices fabricated during fabrication steps of a semiconductor integrated circuit, light emitting devices such as light emitting diodes, and any devices which can be used as light receiving portions or light emitting portions of various apparatus such as light transmission control devices such as liquid crystal panels.

One embodiment of the present invention includes the steps of providing the transparent film 20 including a transparent material on the semiconductor substrate and forming the lens-shaped patterns 29 to be concaved portions recessed to have an arc shape at predetermined positions on the transparent film 20 by a selective etching; optionally performing a thermal process, subjecting the transparent film 20 to a reflow process to have desirable shapes and then forming the interlayer lenses 21a on the transparent film 20. Thus, the interlayer lenses 21a which are uniform and having desirable shapes can be stably formed and the semiconductor apparatus of high quality and high sensitivity can be obtained.

The semiconductor apparatus according to the present invention has the optical axes of the interlayer lenses parallel to the central axes of the opening regions of the light input/output portions, and thus, the light input/output portions efficiently utilize the interlayer lenses.

In one embodiment of the present invention, the interlayer lenses for converging light to the light receiving portions are respectively provided on the transparent film and at predetermined positions above the openings. Thus, the light receiving portions can efficiently receive the light converged by the interlayer lenses.

According to one method for fabricating the semiconductor apparatus of the present invention, the interlayer lenses for converging light to the light receiving portions via the openings are respectively formed above the predetermined positions above the openings. Thus, the interlayer lenses can be stably fabricated and the converging efficiency of the interlayer lenses can be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor apparatus comprising:
    a light input/output portion provided in an upper portion of a semiconductor substrate, the light input/output portion having an opening region for light associated to the light input/output portion to pass through, the opening region having a central axis and being bounded by a light shielding layer;
    a transparent film covering and contacting the opening region, said transparent layer having an upper surface opposite the opening region, wherein said upper surface has a concave region formed therein above the opening region; and
    an interlayer lens provided on the concave region formed in the upper surface of the transparent film, the interlayer lens positioned such that an optical axis of the interlayer lens is aligned with the central axis of the opening region, so that the optical axis of the interlayer lens and the central axis of the opening region are parallel and matched,
    wherein the light shielding layer is asymmetric with respect to the central axis of the opening region, as viewed from a cross-section of the semiconductor apparatus, said central axis being perpendicular to the surface of the semiconductor substrate.

2. A semiconductor apparatus according to claim 1, wherein the light input/output portion includes a light receiving portion for receiving light.

3. A semiconductor apparatus according to claim 1, wherein the transparent film is provided with step portions so as to provide said upper region, and the concaved portion covers the opening region.

4. A semiconductor apparatus according to claim 1, wherein a refractive index of the transparent film is lower than a refractive index of the interlayer lens.

5. A semiconductor apparatus according to claim 4, wherein the transparent film includes a silicon oxide film including at least one of phosphorous (P) and boron (B).

6. A semiconductor apparatus according to claim 4, wherein the transparent film includes an organic high polymer film.

7. A semiconductor apparatus according to claim 1, wherein the transparent film is formed by patterning using selective etching.

8. A semiconductor apparatus according to claim 7, wherein the transparent film is formed by a thermal process after the patterning.

9. A semiconductor apparatus according to claim 1, further comprising:
    a transfer channel provided so as to have a predetermined space from the light input/output portion;
    a first insulating film provided on the semiconductor substrate, the light input/output portion and the transfer channel;
    a transfer electrode provided so as to oppose the transfer channel via the insulating film; and
    a second insulating film provided with an opening for exposing the opening region of the light input/output portion and in which step portions are produced by covering the transfer electrode.

10. A method for fabricating a semiconductor apparatus comprising:
    forming a light input/output portion having an opening region for passing through associated light in an upper portion of a semiconductor substrate, the opening region having a central axis;
    forming a light shield layer with an opening for exposing the opening region of the light input/output portion;
    forming a transparent film so as to cover and contact the opening region, said transparent layer having an upper surface opposite the opening region;
    forming a concave region in the upper surface of the transparent film; and
    forming an interlayer lens provided on the concave region formed in the upper surface of the transparent film, the interlayer lens being formed such that an optical axis of the interlayer lens is aligned with the central axis of the opening region, so that the optical axis of the interlayer lens and the control axis of the opening region are parallel and matched, wherein the light shielding layer is asymmetric with respect to the central axis of the opening region, as viewed from a cross-section of the semiconductor apparatus, said central axis being perpendicular to the surface of the semiconductor substrate.

11. A method for fabricating a semiconductor apparatus according to claim 10, wherein forming the light input/output portion includes forming a light receiving portion for receiving light as the light input/output portion.

12. A method for fabricating a semiconductor apparatus according to claim 10, wherein forming the transparent film includes selectively etching and patterning the transparent film.

13. A method for fabricating a semiconductor apparatus according to claim 12, wherein forming the transparent film includes performing a thermal process after patterning.

14. A method for fabricating a semiconductor apparatus according to claim 12, wherein forming the transparent film includes flattening a surface of the transparent film before the step of patterning.

* * * * *